United States Patent
Rosenbusch et al.

(10) Patent No.: US 12,316,346 B2
(45) Date of Patent: May 27, 2025

(54) ERROR PROCESSING AND CORRECTION OF ADJACENT 2-BIT ERRORS

(71) Applicant: Infineon Technologies AG, Neubiberg (DE)

(72) Inventors: Jens Rosenbusch, Munich (DE); Klaus Oberländer, Neubiberg (DE); Georg Duchrau, Preddöhl (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 5 days.

(21) Appl. No.: 18/355,692

(22) Filed: Jul. 20, 2023

(65) Prior Publication Data
US 2024/0048159 A1 Feb. 8, 2024

(30) Foreign Application Priority Data
Jul. 21, 2022 (DE) .................. 10 2022 118 280.0

(51) Int. Cl.
*H03M 13/00* (2006.01)
*H03M 13/11* (2006.01)

(52) U.S. Cl.
CPC ..... *H03M 13/1174* (2013.01); *H03M 13/616* (2013.01)

(58) Field of Classification Search
CPC . H03M 13/616; H03M 13/151; H03M 13/152
See application file for complete search history.

(56) References Cited

U.S. PATENT DOCUMENTS

| | | | | |
|---|---|---|---|---|
| 7,284,184 B2 * | 10/2007 | Gallezot | ............... | H04L 1/0057 714/776 |
| 7,653,862 B2 * | 1/2010 | Hassner | ................ | H03M 13/19 714/767 |
| 8,055,984 B2 * | 11/2011 | Gallezot | ........... | H04L 25/03866 714/785 |
| 8,196,016 B1 * | 6/2012 | Langner | ................. | H03M 13/11 714/758 |
| 8,875,002 B1 | 10/2014 | Dutta | | |
| 8,972,833 B1 * | 3/2015 | Rahul | ..................... | G06F 11/00 714/800 |
| 9,203,437 B2 * | 12/2015 | Kern | ................... | H03M 13/616 |
| 9,450,613 B2 * | 9/2016 | Kern | ................... | H03M 13/159 |
| 11,462,292 B1 * | 10/2022 | Kim | ................... | H03M 13/1168 |

(Continued)

FOREIGN PATENT DOCUMENTS

| DE | 60220341 T2 | 9/2007 |
|---|---|---|
| DE | 102015121646 A1 | 6/2017 |

(Continued)

*Primary Examiner* — Esaw T Abraham
(74) *Attorney, Agent, or Firm* — Eschweiler & Potashnik, LLC (57) ABSTRACT

What is proposed is a solution for processing errors in a sequence of bits, wherein the sequence of bits, in the error-free case, forms a codeword of an error code, wherein the error code is based on an H-matrix or is able to be determined thereby, wherein an error syndrome is determined for the sequence of bits, wherein a link is determined between components of the error syndrome and parts of the H-matrix, and wherein two adjacent bits in the sequence of bits are corrected if the link adopts a predefined value.

17 Claims, 3 Drawing Sheets

(56) References Cited

U.S. PATENT DOCUMENTS

| | | | |
|---|---|---|---|
| 11,870,459 B2 * | 1/2024 | Solomon | H03M 13/1148 |
| 2003/0023930 A1 | 1/2003 | Fujiwara et al. | |
| 2020/0133763 A1 | 4/2020 | Badack et al. | |

FOREIGN PATENT DOCUMENTS

| | | | |
|---|---|---|---|
| DE | 102018126685 | B3 | 10/2019 |
| DE | 102020110787 | B3 | 9/2021 |

* cited by examiner

ERROR PROCESSING AND CORRECTION OF ADJACENT 2-BIT ERRORS

REFERENCE TO RELATED APPLICATION

This application claims priority to German Application number 10 2022 118 280.0, filed on Jul. 21, 2022, the contents of which are hereby incorporated by reference in their entirety.

BACKGROUND

It is known to correct and/or to detect bit errors in binary data, for example sequences of multiple bits, using error codes.

An error code is in this case either an error correcting code, an error detecting code or a combination of an error detecting and error correcting code.

One example of an error code is the Bose-Chaudhuri-Hocquenghem code (BCH code). In this case, bit error positions to be corrected are determined in the form of zeroes of a locator polynomial of the BCH code. [1] thus describes for example a special procedure for a 2-bit error correction in a Galois field $GF(2^m)$ (also referred to as Galois body $GF(2^m)$) using the BCH code. Proceeding from a corresponding second-degree locator polynomial, this polynomial is transformed such that the zeroes of the transformed polynomial are able to be determined by a parameter of the word width m. This parameter is determined from the syndrome components. The zeroes of the transformed polynomial, after they have been determined, are to be transformed into the zeroes of the original locator polynomial. The bit positions to be corrected may be computed from the zeroes of the original locator polynomial using a decoder.

Another known error correction option using a BCH code is that of first determining, from the syndrome components of the error syndrome, that locator polynomial whose zeroes then in turn indicate the bit positions to be corrected. The zeroes of the locator polynomial may in this case be determined in accordance with the Chien algorithm. This is described by way of example in [2]. In this citation, the locator polynomial is referred to as "error-location polynomial". One disadvantage here is the high amount of time taken to determine the zeroes of the locator polynomial.

SUMMARY

One object is then to improve the known solutions and in particular to provide an approach for being able to perform a faster error correction.

This object is achieved according to the features of the independent claims. Preferred embodiments may be taken in particular from the dependent claims.

What is proposed is a method for processing errors in a sequence of bits, wherein the sequence of bits, in the error-free case, forms a codeword of an error code, wherein the error code is based on an H-matrix or is able to be determined thereby, wherein an error syndrome is determined for the sequence of bits, wherein a link is determined between components of the error syndrome and parts of the H-matrix, wherein two adjacent bits in the sequence of bits are corrected if the link adopts a predefined value.

The error processing comprises in particular the error correction if an error is detected. Otherwise, the error processing may be simply a check for errors.

The method proposed here is used in particular in conjunction with memories, for example SRAMs. The solution may be part of a memory or memory system and provide an error checking and error correcting (ECC: error checking and correcting) service as part of a memory access operation. It is in particular possible for the memory system to implement a physical memory together with the solution described here, and thus to constitute a memory system that is more robust with regard to possible errors.

It is pointed out that different error codes (also referred to as codes) may be used for the approach described here.

The code may correct errors and/or detect errors. A code may for example be designed such that it is able to correct a certain number of errors and detect a larger number of errors.

The error code may be determined by its H-matrix. The wording is also used whereby the H-matrix characterizes the code. An error syndrome results based on the H-matrix. The error syndrome comprises multiple components, and the components of the error syndrome are for example bits. Components of the error syndrome may form a sub-syndrome or multiple sub-syndromes. A sub-syndrome comprises a number of components or bits of the error syndrome.

Based on the error syndrome, a bit vector (that is to say a sequence of bits that are possibly defective) may be checked for the code. If the bit vector is a codeword of the code, then there are no errors (able to be detected by way of the code). It is pointed out here that a codeword is a bit combination that is valid for the code and does not make it possible to detect any errors. In this sense, a codeword for the code taken into consideration is valid or "error-free". The "error-free case" thus means here that the error code does not detect any errors; there are no errors from the point of view of the code. However, there may be errors that the code does not detect. Such errors that are invisible to the code (that is to say not able to be detected and/or not able to be corrected) do not play any role in the current considerations.

This approach makes it possible to quickly correct adjacent 2-bit errors. This is advantageous because, in numerous applications, errors often occur more commonly in an adjacent context, for example in adjacent memory cells.

It is pointed out here that the proposed solution is not restricted to a specific neighborhood, that is to say a particular locality of adjacent physical units, for example memory cells. For example, physically adjacent or functionally adjacent memory cells or blocks could accordingly contain adjacent bits according to the solution proposed here. Adjacent memory cells may thus be memory cells that are arranged next to one another, above one another or adjacently in some other context. It is in particular also possible for non-adjacent memory cells to become (functionally) adjacent memory cells as a result of resorting or permutation. The bits addressed in the claim are thus not restricted to a local neighborhood: On the contrary, the required neighborhood may be given in a purely functional (or logical) manner, such that the bits are adjacent only from the point of view of the code.

Adjacent errors may for example arise when spatially adjacent memory cells are distorted by a neutron or by a-radiation (at the same time) or when temporally successive bits are distorted for example in a data transmission.

If for example a neutron impacts a number of spatially successive memory cells in the direction of a word line of a memory, then the content of multiple (adjacent) memory cells may thereby be distorted.

The approach proposed here makes it possible to efficiently correct adjacent errors.

One development is for two adjacent bits in the sequence of bits to be corrected and for a component of the error syndrome to be inverted when the corresponding linked components of the columns of the H-matrix have an odd number of ones, and not to be inverted when the corresponding linked components of the columns of the H-matrix have an even number of ones.

It is pointed out here that 0 is also an even number.

One development is for two bits in the sequence of bits to be corrected by way of a correction signal, wherein the correction signal is determined based on a Boolean link between the inverted components of the error syndrome and the non-inverted components of the error syndrome.

The Boolean link may for example comprise at least one of the following links: NOR (NOT-OR), OR, NAND (NOT-AND) and AND. These are Boolean functions with what is known as a controlling value (see [6]). Boolean links equivalent thereto may in particular be used.

One development is for two bits in the sequence of bits to be corrected if the link adopts a predefined value in a predefined number of components.

One development is for the predefined number of components to correspond to a number of fewer than all of the components.

One development is for the two bits in the sequence of bits not to be corrected if the link does not adopt the predefined value and/or adopts a value different from the predefined value.

One development is for the components of the error syndrome to be sub-error syndromes of the error syndrome.

One development is for the parts of the H-matrix to be
components of the H-matrix,
columns of the H-matrix, and/or
sub-matrices of the H-matrix.

One development is for each of the bits to have a bit position that corresponds to a column of the H-matrix.

One development is for components of the error syndrome to be linked with parts of the H-matrix by linking the components of the error syndrome with at least two columns of the H-matrix or with components of two columns of the H-matrix.

One development is for the two columns of the H-matrix to be adjacent to one another.

One development is for components of adjacent columns of the H-matrix to be linked with components of the error syndrome.

One development is for the predefined value to be equal to a vector $\vec{0}$ or equal to a vector $\vec{1}$.

One development is for the error code to be able to correct at least 2-bit errors.

One development is for the error code to be a BCH code, for the error syndrome to comprise a first sub-error syndrome and a second sub-error syndrome and for components of the first sub-error syndrome to be linked with corresponding components of columns of the H-matrix.

One option is for the second error syndrome not to be linked with components of the H-matrix.

One development is for at least two of the bits of the sequence of bits to be able to be corrected simultaneously or at least partially simultaneously.

In other words, multiple bits may be corrected with a time overlap, that is to say not exclusively successively (that is to say not just sequentially, but rather partially or completely in parallel). For the sake of completeness, it is mentioned that it is also an option for multiple bits, for example some of the bits to be corrected, to be corrected in succession.

What is also proposed is a computer program product that is able to be loaded directly into a memory of a digital computer and comprises program code portions that are configured to perform steps of the method described herein.

Also set forth is a device for processing errors in a sequence of bits, wherein the device has a processing unit that is configured such that the steps of the method described herein are carried out.

The processing unit mentioned here may in particular be designed as a processor unit and/or as an at least partially hard-wired (for example logic) circuit arrangement, which is for example configured such that the method as described herein is able to be performed. Said processing unit may be or comprise any kind of processor or computer with correspondingly required peripherals (memories, input/output interfaces, input/output devices, etc.). The above explanations regarding the method apply accordingly to the device. The device may be implemented in one component or in a manner distributed in multiple components.

The abovementioned object is also achieved by way of a system comprising at least one of the devices described herein.

One development is for the device to comprise a memory containing the sequence of bits.

One development is for the device to be a memory or a memory system.

BRIEF DESCRIPTION OF THE DRAWINGS

The above-described properties, features and advantages of this invention and the way in which these are achieved will be described below in connection with a schematic description of exemplary embodiments that are explained in more detail in connection with the drawings. In this case, for the sake of clarity, identical or functionally identical elements may be provided with the same reference signs.

DETAILED DESCRIPTION

What is proposed for example is fast parallel correction of adjacent 2-bit errors.

This approach may be used in particular for linear error codes (also referred to below as codes) that are suitable for correcting adjacent 2-bit errors. Hamming codes are one type of linear error code. For the purposes of Hamming codes, two Hamming matrices can be defined: a code generator matrix G and a parity-check matrix H:

$$G^T := \begin{pmatrix} 1 & 1 & 0 & 1 \\ 1 & 0 & 1 & 1 \\ 1 & 0 & 0 & 0 \\ 0 & 1 & 1 & 1 \\ 0 & 1 & 0 & 0 \\ 0 & 0 & 1 & 0 \\ 0 & 0 & 0 & 1 \end{pmatrix}, H := \begin{pmatrix} 1 & 0 & 1 & 0 & 1 & 0 & 1 \\ 0 & 1 & 1 & 0 & 0 & 1 & 1 \\ 0 & 0 & 0 & 1 & 1 & 1 & 1 \end{pmatrix}.$$

The starting point is for example a linear error code (also referred to as code) having a parity-check matrix (H-matrix) characterizing this code $$H=(h^0,h^1,h^2,h^3,\ldots,h^{n-1}),$$

wherein $$h^0,h^1,h^2,h^3,\ldots,h^{n-1}$$

are column vectors of the H-matrix. A bit vector v' with n bits is also given:

$$v'=(v'_0,v'_1,\ldots,v'_{n-1}).$$

The bit vector v' may potentially contain defective bits. An error syndrome S $$S=H\cdot v'$$

is determined for the bit vector v'.

The bit vector v' may result from bit errors from a code vector $$v=(v_0,v_1,\ldots,v_{N-1})$$

of the code. The code vector v is also referred to as codeword of the code.

If $$v=v'$$

then the bit vector v' is the same as the codeword v, and thus no (detectable) error has occurred.

For the codeword v, it holds for the error syndrome S that:

$$S=H\cdot v=\vec{0}$$

For a 2-bit error at the bit positions i and j, the error syndrome S results as $$S=h^i+h^j,$$

and for an adjacent 2-bit error at the bit positions i and i+1, the error syndrome S results as $$S=h^i+h^{i+1}.$$

The approach proposed here may be applied in particular when adjacent 2-bit errors to be corrected have a different error syndrome.

If all adjacent 2-bit errors of the code have a separate error syndrome that differs from all other error syndromes of adjacent 2-bit errors, the solution proposed here may be used to correct all of these adjacent 2-bit errors.

If the error syndromes of 1-bit errors are different from all error syndromes of adjacent 2-bit errors, then 1-bit errors may also be corrected.

If the error syndromes of all non-adjacent 2-bit errors are different from all error syndromes of the adjacent 2-bit errors to be corrected, then the non-adjacent 2-bit errors may differ from adjacent 2-bit errors based on their error syndrome.

The following expressions may be used for the error correction of adjacent 2-bit errors:

$$S+h^0+h^1$$
$$S+h^1+h^2$$
$$S+h^2+h^3$$
$$S+h^3+h^4$$
$$\vdots$$
$$S+h^{n-2}+h^{n-1}$$

Components of the bit vector v' may accordingly be corrected as follows:

The components $v'_0$ and $v'_1$ are corrected to components $$v_0^{cor}=v'_0+1 \text{ and}$$

$$v_1^{cor}=v'_1+1$$

when $$S+h^0+h^1=\vec{0}.$$

The components $v'_1$ and $v'_2$ are corrected to components $$v_1^{cor}=v'_1+1 \text{ and}$$

$$v_2^{cor}=v'_2+1$$

when $$S+h^1+h^2=\vec{0}$$

The components $v'_2$ and $v'_3$ are corrected to components $$v_2^{cor}=v'_2+1 \text{ and}$$

$$v_3^{cor}=v'_3+1$$

when $$S+h_2+h_3=\vec{0}$$

The components $v'_3$ and $v'_4$ are corrected to components $$v_3^{cor}=v'_3+1 \text{ and}$$

$$v_4^{cor}=v'_4+1$$

when $$S+h^3+h^4=\vec{0}$$

The components $v'_{n-2}$ and $v'_{n-1}$ are corrected to components $$v_{n-2}^{cor}=c'_{n-2}+1 \text{ and}$$

$$v_{n-1}^{cor}=v'_{n-1}+1$$

when $$S+h^{n-2}+h^{n-1}=\vec{0}$$

In this case, "+" denotes the component wise XOR linking of the corresponding binary vectors.

One option is to correct the corresponding bits at the bit positions i and i+1 when for example $$S+h^i+h^{i-1}=\underbrace{(1,1,\ldots,1)}_{M}{}^T$$

wherein M is the number of components of the column vector h'. The vector $$\underbrace{(1,1,\ldots,1)}_{M}{}^T$$

is an exemplary population. Other populations of the vector are also possible. It is in particular not necessary for all of the bits of the vector to have the same value.

The superscript T after the vector indicates that it is the transposed vector.

By way of example, the bit positions i and i+1 should be corrected when $$S+h^i+h^{i+1}=(b_1,b_2,\ldots,b_M)^T$$

and a subset $$\{b_{i_1},b_{i_2},\ldots,b_{i_N}\}$$

of the bits $$b_1,b_2,\ldots,b_M$$

where N<M, adopt a particular value, for example the value 0.

This is described further below by way of example for a 2-bit error correcting BCH code in a Galois field $GF(2^m)$. There, the error syndrome $S=[s_1,s_3]$, where M=2m, has the two m-component sub-syndromes $s_1$ and $s_3$ and an adjacent 2-bit error is able to be corrected when the m-dimensional sub-syndrome $s_1$ has a predetermined value, for example the value $$\underbrace{(0,\ldots,0)^T}_{m}$$

Since the column vectors $$h^0,h^1,\ldots,h^{n-1}$$

are constant binary column vectors of the H-matrix, the expressions $$S+h^0+h^1$$
$$\vdots$$
$$S+h^{n-2}+h^{n-1}$$

may be achieved by converting (or not converting) the components of the error syndrome S, which simplifies implementation in comparison with more complex XOR gates.

If for example the error syndrome $$S=(S_1,S_2,\ldots,S_M)^T$$

where M>1, is an M-component binary vector and the column vector $$h^i=(h_1^i,h_2^i,\ldots,h_M^i)^T$$

is an M-component binary column vector of the H-matrix of the error code, then $$S+h^i+h^{i+1}$$

is determined by inverting those components of the error syndrome S for which exactly one of the corresponding components of the column vector $h^i$ or of the column vector $h^{i+1}$ is equal to 1 and not inverting those components of the error syndrome S for which the corresponding components of the column vector vector $h^i$ and of the column vector $h^{i+1}$ are the same (that is to say either both equal to 1 or both equal to 0).

It then holds for example for i=0, n−1 and j=1, M $$S+h^i+h^{i+1}=\begin{pmatrix}S'_1\\S'_2\\\vdots\\S'_M\end{pmatrix} \text{ with } S'_j=\begin{cases}S_j & \text{for } h_j^i+h_j^{i+1}=0\\\overline{S}_j=S_j+1 & \text{for } h_j^i+h_j^{i+1}=1\end{cases} \quad (1)$$

One option is that of not inverting those components of the error syndrome S for which exactly one of the corresponding components of $h^i$ and $h^{i\pm1}$ is equal to 1 and inverting (only) those components of the error syndrome S for which the corresponding components of $h^i$ and $h^{i+1}$ are either both equal to 1 or both equal to 0.

$S+h^i$ may also be determined by inverting those components of the error syndrome S for which the corresponding component of $h^i$ is equal to 1.

It will be explained below that, in addition to adjacent 2-bit errors, 1-bit errors may also be corrected.

If a 1-bit error is present at the bit position k, the error syndrome is determined as $$S=h^k$$

and it holds that $$S+h^k=h^k+h^k=\vec{0}$$

For a bit position L, where L≠k, it holds that $$S+h^L=h^k+h^L\neq\vec{0}$$

The following expressions may be used for the error correction of 1-bit errors:

$$S+h^0$$
$$S+h^1$$
$$S+h^2$$
$$S+h^3$$
$$\vdots$$
$$S+h^{n-2}$$
$$S+h^{n-1}$$

Components of the bit vector v' may accordingly be corrected as follows:

The component $v'_0$ is corrected to the component $$v_0^{cor}=v'_0+1$$

when $$S+h^0=\vec{0}$$

The component $v'_1$ is corrected to the component $$v_1^{cor}=v'_1+1$$

when $$S+h^1=\vec{0}$$

The component $v'_2$ is corrected to the component $$v_2^{cor}=v'_2+1$$

when $$S+h^2=\vec{0}$$

The component $v'_3$ is corrected to the component $$v_3^{cor}=v'_3+1$$

when $$S+h^3=\vec{0}$$

The component is corrected to the component $$v_{n-2}^{cor}=v'_{n-2}+1$$

when $$S+h^{n-2}=\overline{0}$$

The component $v'_{n-1}$ is corrected to the component $$v_{n-1}^{cor}=v'_{n-1}+1$$

when $$S+h^{n-1}=\overline{0}$$

If both 1-bit errors and adjacent 2-bit errors are to be corrected, the following expressions may be used:

$$S+h^0, \quad S+h^0+h^1$$
$$S+h^1, \quad S+h^1+h^2$$
$$S+h^2, \quad S+h^2+h^3$$
$$S+h^3, \quad S+h^3+h^4$$
$$\vdots$$
$$S+h^{n-2}, \quad S+h^{n-2}+h^{n-1}$$
$$S+h^{n-1}$$

It then accordingly holds that:

The component $v'_0$ is corrected to the component $$v_0^{cor}=v'_0+1$$

if $$S+h^0=\overline{0} \text{ or}$$

$$S+h^0+h^1=\overline{0}$$

The component $v'_1$ is corrected to the component $$v_1^{cor}=v'_1+1$$

if $$S+h^1=\overline{0} \text{ or}$$

$$S+h^0+h^1=\overline{0} \text{ or}$$

$$S+h^1+h^2=\overline{0}$$

The component $v'_2$ is corrected to the component $$v_2^{cor}=v'_2+1$$

if $$S+h^2=\overline{0} \text{ or}$$

$$S+h^1+h^2=\overline{0} \text{ or}$$

$$S+h^2+h^3=\overline{0}$$

The component $v'_3$ is corrected to the component $$v_3^{cor}=v'_3+1$$

if $$S+h^3=\overline{0} \text{ or}$$

$$S+h^2+h^3=\overline{0} \text{ or}$$

$$S+h^3+h^4=\overline{0}$$

The component $v'_{n-2}$ is corrected to the component $$v_{n-2}^{cor}=v'_{n-2}+1$$

if $$S+h^{n-2}=\overline{0} \text{ or}$$

$$S+h^{n-3}+h^{n-2}=\overline{0} \text{ or}$$

$$S+h^{n-2}+h^{n-1}=\overline{0}$$

The component $v'_{n-1}$ is corrected to the component $$v_{n-1}^{cor}=v'_{n-1}+1$$

if $$S+h^{n-1}=\overline{0} \text{ or}$$

$$S+h^{n-2}+h^{n-1}=\overline{0}.$$

The approach described here may be applied to error codes that have different error syndromes for adjacent 2-bit errors to be corrected. Examples of such error codes are:
- an error code that is able to correct two adjacent bit errors and a 1-bit error (for example an Abramson code, see [3]),
- an at least 2-bit error correcting BCH code,
- a code that is able to correct at least 2-bit errors, as described for example in [4],
- a code in which a (larger) code composed of sub-codes is formed, wherein the code is suitable for correcting adjacent 2-bit errors and for detecting non-adjacent 2-bit errors (such a code is disclosed for example in [5]),
- another linear code.

One option, in the case of a 2-bit error correcting code, is to correct adjacent 2-bit errors in accordance with the described method and then, if there are no adjacent 2-bit errors, but rather a non-adjacent error, to detect the non-adjacent error or likewise to correct same.

The approach proposed here is particularly advantageous when adjacent 2-bit errors occur commonly, since a particularly fast and thus efficient correction is proposed for these.

Figure 1:
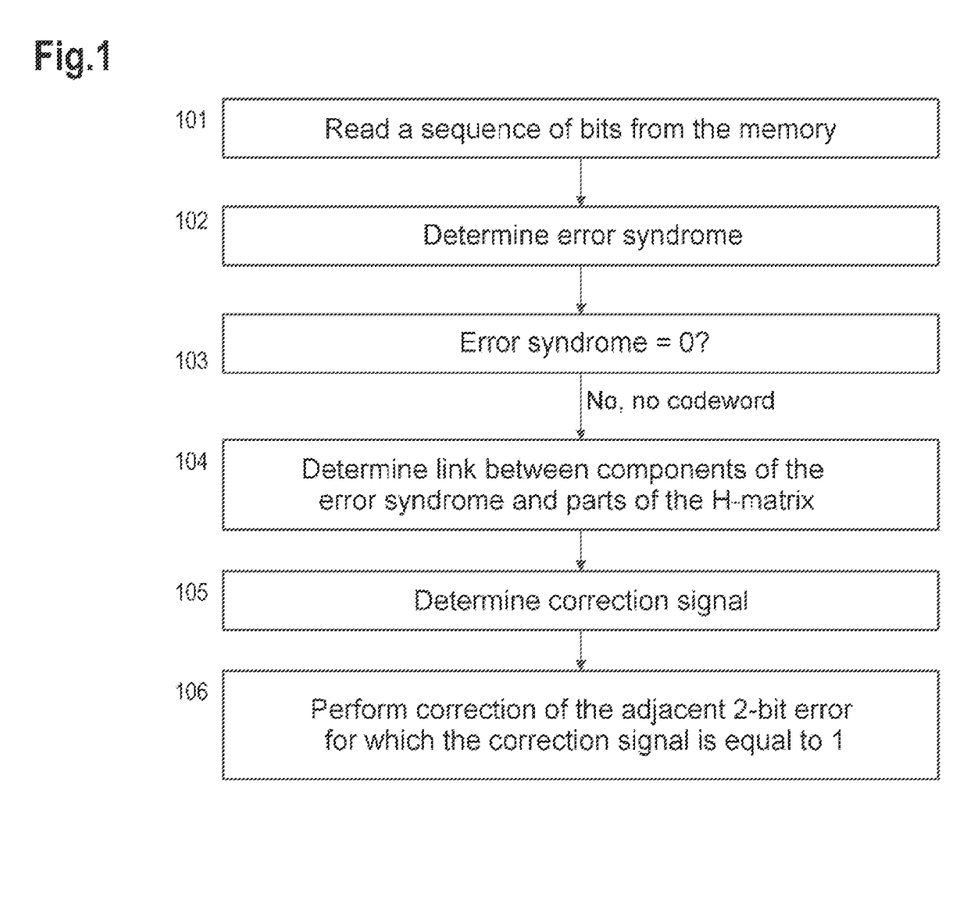
FIG. 1 shows a flowchart for illustrating one exemplary variant of the solution for processing errors as proposed here, and in particular for correcting adjacent 2-bit errors.

FIG. 1 shows a flowchart for illustrating one exemplary variant of the proposed solution for error processing, and in particular for correcting adjacent 2-bit errors.

Step 101: A sequence of bits is read from a memory. The memory may be an SRAM or another memory.

Step 102: An error syndrome is determined. The error code is based on an H-matrix. An error syndrome results based on this H-matrix and comprises multiple components. Components of the error syndrome may be combined to form sub-syndromes.

Step 103: It is checked whether the error syndrome is equal to 0 or other than 0. If the error syndrome is equal to 0, then the sequence of bits forms a codeword of the error code. No error is recognized and no correction is made. The method may be ended for this sequence. If the error syndrome is other than 0, the method is continued with the next step.

Step 104: Components of the error syndrome are linked with parts of the H-matrix. Such parts of the H-matrix may be components of two adjacent columns of the H-matrix.

One option is for the components of the error syndrome to be linked with the components of a multiplicity of adjacent columns in parallel or at least in a temporally overlapping manner, so as to result in different linked values for the different adjacent columns. In this case, the multiplicity of adjacent columns may comprise all columns.

Step 105: The correction signal is determined. The correction signal is 1 when the linked value of the error syndrome with the components of two adjacent columns adopts the predefined value. The correction signal is 0 when it adopts a value different from the predefined value. There is thus a correction signal 1 for exactly one combination of two adjacent columns, and a correction signal 0 for all other combinations of adjacent columns.

If no adjacent 2-bit error is present, no combination of the error syndrome with the components of two adjacent columns of the H-matrix is equal to the predefined value, and the correction signal for all combinations is equal to 0.

Step 106: If the correction signal is 1, the associated adjacent 2-bit error is corrected.

EXAMPLE

The following H-matrix is used by way of example as an explanation:

$$H = \begin{pmatrix} 1 & 0 & 0 & 1 & 0 & 1 \\ 0 & 1 & 0 & 1 & 1 & 1 \\ 0 & 0 & 1 & 0 & 1 & 1 \\ 1 & 1 & 1 & 1 & 1 & 1 \end{pmatrix} = (h^0, h^1, h^2, h^3, h^4, h^5) \quad (2)$$

The H-matrix according to equation (2) thus comprises the six column vectors:

$h^0=(1,0,0,1)^T$, $h^1=(0,1,0,1)^T$, $h^2=(0,0,1,1)^T$, $h^3=(1,1,0,1)^T$, $h^4=(0,1,1,1)^T$ and $h^5=(1,1,1,1)^T$.

In this example, the notation introduced above applies accordingly:

$n=6$ $M=4$ $S=S_1,S_2,S_3,S_4$.

A check reveals that the following column vectors $h^0+h^1, h^1+h^2, h^2+h^3, h^3+h^4, h^4+h^5$ and $h^0, h^1, h^2, h^3, h^4, h^5$ are pairwise different.

The correction takes place when either a 1-bit error or an adjacent 2-bit error has been determined.

Figure 2:
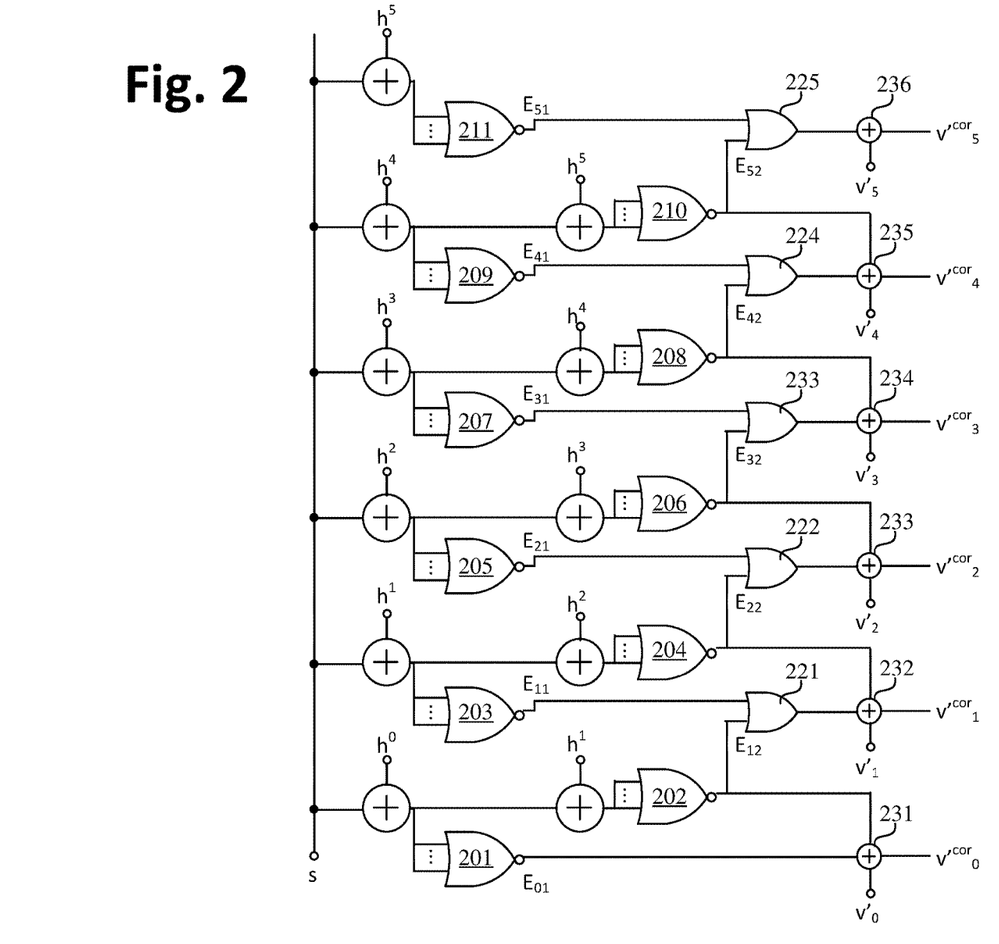
FIG. 2 shows one exemplary embodiment of a correction circuit for 1-bit errors and adjacent 2-bit errors.

For the H-matrix according to equation (2), FIG. 2 shows one exemplary embodiment of a correction circuit for 1-bit errors and adjacent 2-bit errors.

The potentially defective binary vector $v'=(v'_0, v'_1, v'_2, v'_3, v'_4, v'_5)$ is corrected by the circuit shown in FIG. 2 to a corrected vector $v^{cor}=(v_0^{cor}, v_1^{cor}, v_2^{cor}, v_3^{cor}, v_4^{cor}, v_5^{cor})$ using signals $E_{01}, E_{21}, E_{31}, E_{41}, E_{51}$ and $E_{12}, E_{22}, E_{32}, E_{42}, E_{52}$ The signal $E_{01}$ results from a component wise linking of the components $S_1$ to $S_4$ of the error syndrome S with the components of the 0th column $h^0=(1,0,0,1)^T$ of the H-matrix according to equation (2), wherein a downstream NOR gate (NOT OR gate) is used to check whether all components of $S+h^\circ$ are equal to 0.

It holds that:

$$E_{01} = NOR(S_1 + 1, S_2, S_3, S_4 + 1) =$$
$$= NOR(\overline{S}_1, S_2, S_3, \overline{S}_4).$$

$E_{01}$ is thus 1 whenever all of the inputs of the NOR gate are equal to 0. This is the case for $S_1=1$ $S_2=0$ $S_3=0$ $S_4=1$ According to the present example, it holds that $S+h^0=(\overline{S}_1, S_2, S_3, \overline{S}_4)^T$, $S+h^1=(S_1, \overline{S}_2, S_3, \overline{S}_4)^T$, $S+h^2=(S_1, S_2, \overline{S}_3, \overline{S}_4)^T$, $S+h^3=(\overline{S}_1, \overline{S}_2, S_3, \overline{S}_4)^T$, $S+h^4=(S_1, \overline{S}_2, \overline{S}_3, \overline{S}_4)^T$, $S+h^5=(\overline{S}_1, \overline{S}_2, \overline{S}_3, \overline{S}_4)^T$ and $S+h^0+h^1=(\overline{S}_1, \overline{S}_2, S_3, S_4)^T$, $S+h^1+h^2=(S_1, \overline{S}_2, \overline{S}_3, S_4)^T$, $S+h^2+h^3=(\overline{S}_1, \overline{S}_2, \overline{S}_3, S_4)^T$, $S+h^3+h^4=(\overline{S}_1, S_2, \overline{S}_3, S_4)^T$, $S+h^4+h^5=(\overline{S}_1, S_2, S_3, S_4)^T$.

According to the above explanations, it follows directly from this that:

$E_{01}=NOR(\overline{S}_1, S_2, S_3, \overline{S}_4)$, $E_{11}=NOR(S_1, \overline{S}_2, S_3, \overline{S}_4)$, $E_{21}=NOR(S_1, S_2, \overline{S}_3, \overline{S}_4)$, $E_{31}=NOR(\overline{S}_1, \overline{S}_2, S_3, \overline{S}_4)$, $E_{41}=NOR(S_1, \overline{S}_2, \overline{S}_3, \overline{S}_4)$, $E_{51}=NOR(\overline{S}_1, \overline{S}_2, \overline{S}_3, \overline{S}_4)$, and $E_{12}=NOR(\overline{S}_1, \overline{S}_2, S_3, S_4)$, $E_{22}=NOR(S_1, \overline{S}_2, \overline{S}_3, S_4)$, $E_{32}=NOR(\overline{S}_1, \overline{S}_2, \overline{S}_3, S_4)$, $E_{42}=NOR(\overline{S}_1,S_2,\overline{S}_3,S_4)$, $E_{52}=NOR(\overline{S}_1,S_2,\overline{S}_3,S_4)$, FIG. 2 shows the generation of the correction signals $v_0^{cor}$ or to $v_5^{cor}$ based on the associated possibly defective bits $v'_0$ to $v'_5$ and the signals $E_{01}$ to $E_{52}$:

$v_0^{cor}=v'_0+E_{01}+E_{12}$, $v_1^{cor}=v'_1+(E_{12}vE_{11})+E_{22}$, $v_2^{cor}=v'_2+(E_{22}vE_{21})+E_{32}$, $v_3^{cor}=v'_3+(E_{32}vE_{31})+E_{42}$, $v_4^{cor}=v'_4+(E_{42}vE_{41})+E_{52}$, $v_5^{cor}=v'_5+(E_{52}vE_{51})$.

In this case, "+" again denotes the Exclusive Or operation (XOR) and "v" indicates the logic Or link (implemented in FIG. 2 by an OR gate). The above links are implemented in FIG. 2 by way of OR gates 121 to 125 and XOR gates (Exclusive Or gates) 131 to 136.

The signals $E_{01}$ to $E_{52}$ are indicated by way of example in FIG. 2 based on the components $S_1$ to $S_4$ of the error syndrome S, linked with the column vectors $h^0$ to $h^5$ of the H-matrix by way of NOR gates (NOT OR gates) 101 to 111, as also shown in equations (3) and (4).

In this case, the correction signals are determined for example by way of a NOR link between corresponding syndrome components or inverted syndrome components. Instead of the NOR link, other equivalent Boolean expressions (or gates) may also be used. By way of example, any of the following Boolean functions may be used: AND, OR, NOR (NOT OR), NAND (NOT AND). Inverters may also be used.

The Boolean functions AND, NAND, OR and NOR that may be used to determine the correction signals are Boolean functions having a determining value (what is called a controlling value, see also [6]).

The determining value of the functions AND and NAND is the value 0. If one of the variables on which the AND function depends adopts the value 0, then the value determined by the AND function is always 0. If one of the variables on which the NAND function depends adopts the value 0, then the value determined by the NAND function is always equal to 1.

The determining value of the functions OR and NOR is the value 1. If one of the variables on which the OR function depends adopts the value 1, then the value determined by the OR function is always equal to 1. If one of the variables on which the NOR function depends adopts the value 1, then the value determined by the NOR function is always equal to 0.

By way of example, the correction signal $E_{42}=NOR(\overline{S}_1,S_2,\overline{S}_3,S_4)$ from equation (4), instead of the NOR function, may also be implemented by way of the AND function in conjunction with inverters:

$E_{42}=AND(S_1,\overline{S}_2,S_3,\overline{S}_4)$

The NOR link gives the value 1 for the population $$\begin{pmatrix}\overline{S}_1\\S_2\\\overline{S}_3\\S_4\end{pmatrix}=\begin{pmatrix}1\\0\\1\\0\end{pmatrix},$$

since the result 0 is present only when all inputs of the NOR gate are equal to 0. For the components $S_1$ and $S_3$, this is ensured by way of inverters.

The AND link accordingly gives the value 1 for the population $$\begin{pmatrix}S_1\\\overline{S}_2\\S_3\\\overline{S}_4\end{pmatrix}=\begin{pmatrix}1\\0\\1\\0\end{pmatrix},$$

since, in the case of the AND link, the value 1 is achieved only when all inputs of the AND gate are equal to 1.

It is pointed out that the circuit shown in FIG. 2 (and also in FIG. 3) should be understood to be exemplary. Other implementations, in particular using different gate logic, are also possible.

The signals $E_{01}$ to $E_{52}$ are binary values. In the present example, at most one of the signals $E_{01}$ to $E_{52}$ is equal to 1.

If a 1-bit error is present, one of the signals $E_{01}$, $E_{11}$, $E_{21}$, $E_{31}$, $E_{41}$, $E_{51}$ is equal to 1 and the 1-bit error is corrected. The bit $v'_1$ is thus for example corrected to a bit $v_1^{cor}=v'_1+1$ when $E_{11}=1$.

If an adjacent 2-bit error is present, one of the signals $E_{12}$, $E_{22}$, $E_{32}$, $E_{42}$, $E_{52}$ is equal to 1 and the adjacent 2-bit error is corrected. The bit $v'_2$ is thus for example corrected to a bit $v_2^{cor}=c'_2+1$ and a bit $v'_3$ is corrected to a bit $v_3^{cor}=v'_3+1$ when $E_{32=1}$ and an adjacent 2-bit error is present at the bit positions 2 and 3.

Figure 3:
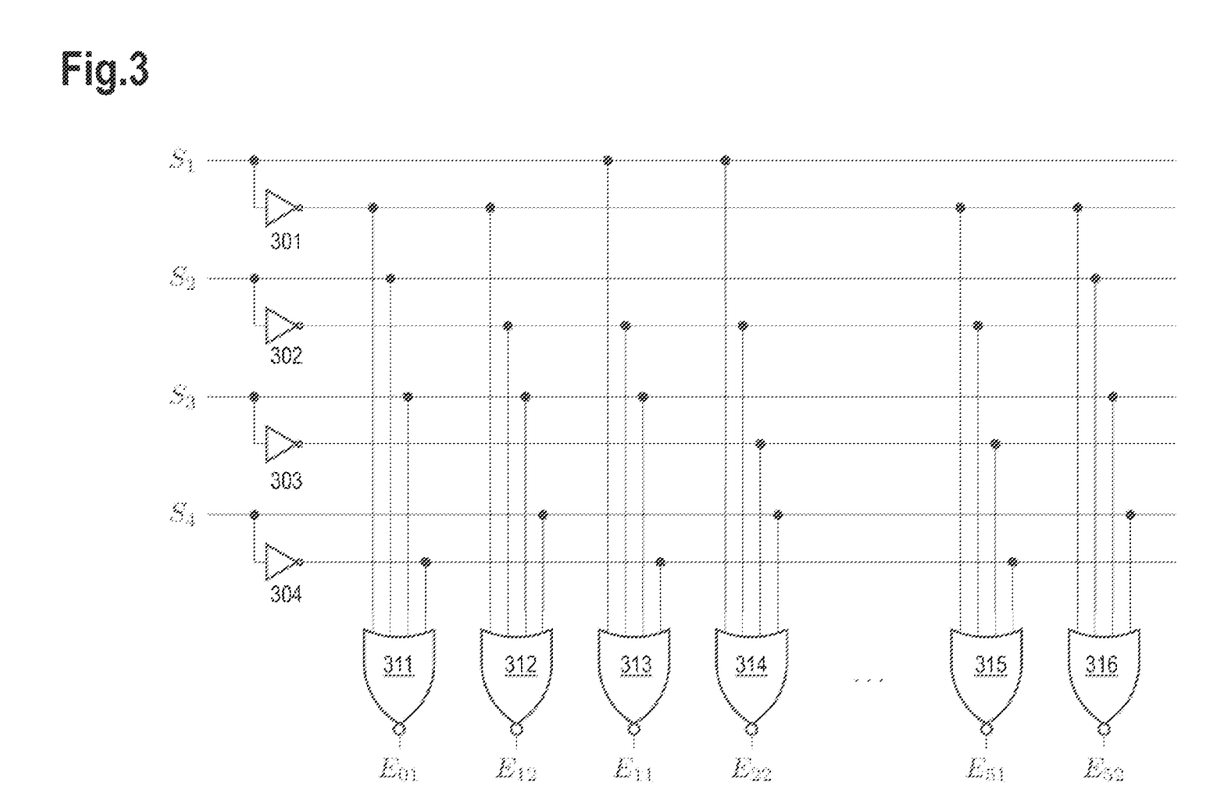
FIG. 3 shows a schematic arrangement for determining signals $E_{01}$ to $E_{52}$ based on sub-error syndromes $S_j$, $\overline{S}_j$ of the error syndrome S by way of inverters.

FIG. 3 shows a schematic arrangement for determining the signals $E_{01}$ to $E_{52}$ based on the sub-error syndromes $S_1,\overline{S}_1,S_2,\overline{S}_2,S_3,\overline{S}_3,S_4,\overline{S}_4$ of the error syndrome S by way of inverters 301 to 304.

For each of the eleven signals $E_{01}$ to $E_{52}$ (for the sake of simplicity, only six of these signals are illustrated in FIG. 3), there is a NOR gate 311 to 316 that indicates, according to equations (3) and (4), the combination of sub-error syndromes on which the respective signal is based.

In FIG. 3, each sub-error syndrome S of the error syndrome S is provided once in non-inverted form as $S_j$ and once in inverted form as $\overline{S}_j$. For each of the signals $E_{01}$ to $E_{52}$, a selection is made, according to the links shown in FIG. 3 for each sub-error syndrome, as to whether it contributes to the signal in its non-inverted form or in its inverted form. The selected sub-error syndromes are then linked via the NOR gates 311 to 316 to form one of the signals $E_{01}$ to $E_{52}$.

It is additionally pointed out that the correction signals may be determined simultaneously or at least partially simultaneously (in parallel or in a temporally overlapping manner), as also illustrated for example in present FIGS. 1 and 2.

BCH Code

The application of a 2-bit error correcting BCH code is discussed by way of example below.

The H-matrix of a 2-bit error correcting BCH code over a Galois field $GF(2^m)$ with the generator element a may be described for example as $$H = (h^0, h^1, \ldots, h^{n-1}) = \begin{pmatrix} H_1 \\ H_3 \end{pmatrix} = \begin{pmatrix} \alpha^0 & \alpha^1 & \alpha^2 & \alpha^3 & \ldots & \alpha^{n-1} \\ \alpha^0 & \alpha^3 & \alpha^6 & \alpha^9 & \ldots & \alpha^{3(n-1)} \end{pmatrix} \quad (5)$$

In this case, $H_1$ and $H_3$ are sub-matrices of the H-matrix.

This is explained in [7] by way of example for m=4. Page 148 thereof shows what is called a parity check matrix, in which $\alpha^0$ is denoted by 1 in accordance with the one element of the Galois field. Page 149 above shows the parity check matrix in its binary form (with binary column vectors).

The values a' in equation (5) may be interpreted as elements of the Galois field $GF(2^m)$ in its vector representation as m-component column vectors. The exponents of a should be interpreted modulo $(2^m-1)$. The error syndrome $$S = [S_1, S_3]$$

contains sub-error syndromes $s_1$ and $s_3$, which are determined as follows:

$$s_1 = H_1 \cdot v', \quad (6)$$

$$s_3 = H_3 \cdot v'. \quad (7)$$

In this case, v' again denotes the potentially defective binary vector. The error syndrome S has M=2 m components.

For an adjacent 2-bit error at the positions i and i+1, it holds that $$s_1 = \alpha^i + \alpha^{i+1} = a^i(1+\alpha) \quad (8)$$

and $$s_3 = \alpha^{3i} + \alpha^{3i+3} = a^{3i}(1+\alpha^3) \quad (9)$$

It results from this that $$\frac{s_1^3}{s_3} = \frac{(1+\alpha)^3}{1+\alpha^3} \quad (10)$$

or $$s_1^3(1+\alpha^3) = s_3(1+\alpha)^3. \quad (11)$$

Equation (11) does not apply to a non-adjacent 2-bit error or to a 1-bit error.

For any 2-bit error, $s_1$ is always other than 0. In cases in which the denominator of the quotient of equation (10) or the denominator of one of the quotients of the following equations adopts the value 0, the respective reciprocal form may be used.

It is thus possible for a 2-bit correcting BCH code to correct adjacent 2-bit errors using just the sub-error syndrome $s_1$ and then to check whether equation (11) is satisfied: If the equation is satisfied, then there are no non-adjacent 2-bit errors and also no 1-bit errors.

For a 2-bit error correcting BCH code, the ith and the i+1th bit are corrected when $$s_1 + \alpha^i + \alpha^{i+1} = \overline{0} \quad (12)$$

and equation (11) holds.

In this case, it is sufficient to functionally link only one true subset of the m components of the error syndrome (from the 2·m components), namely the m components of the sub-error syndrome $s_1$, with the components of the columns $a^0, a^1, \ldots, a^{n-1}$ of the submatrix $H_1$ in order to determine correction signals for the different bit positions.

One exemplary approach for correcting possible defective (adjacent) bits may comprise the following steps:

1. It is checked whether the condition according to equation (11)

$$s_1^3(1+\alpha^3) = s_3(1+\alpha)^3$$

is satisfied. In this case, the sub-error syndromes $s_1$ and $s_3$ are known from equations (6) and (7) and a is determined by the H-matrix according to equation (5). If this condition is not satisfied, no error correction takes place. If on the other hand the condition is satisfied, the following step is carried out.

2. It is checked for the individual bit positions i whether the condition according to equation (12)

$$s_1 + \alpha^i + \alpha^{i+1} = \overline{0}$$

is satisfied:

a) It is checked for the 0th bit position whether $$s_1 + \alpha^0 + \alpha^1 = \overline{0}$$

is satisfied. If it is, a correction at the bit positions 0 and 1 takes place. If it is not, no correction takes place.

b) It is checked for the 1st bit position whether $$s_1 + \alpha^1 + \alpha^2 = \overline{0}$$

is satisfied. If it is, a correction at the bit positions 1 and 2 takes place. If it is not, no correction takes place.

c) It is checked for the (n−2)th bit position whether $$s_1 + a^{n-2} + a^{n-1} = \overline{0}$$

is satisfied. If it is, a correction at the bit positions (n−2) and (n−1) takes place. If it is not, no correction takes place.

It will be shown below that a 2-bit error for a 2-bit error correcting BCH code is adjacent when one of the equations (10) or (11) holds, that is to say $$\frac{s_1^3}{s_3} = \frac{(1+\alpha)^3}{1+\alpha^3} \text{ or } s_1^3(1+\alpha^3) = s_3(1+\alpha)^3.$$

A 2-bit error at the positions j and j+p is considered and it is shown that p=1 or p=−1 is then satisfied and the error is necessarily adjacent.

For the 2-bit error under consideration, it holds that:

$$s_1 = \alpha^j + \alpha^{j+p} = \alpha^j(1+\alpha^p),$$

$$s_3 = \alpha^{3j} + \alpha^{3j+3p} = \alpha^{3j}(1+\alpha^{3p}) \text{ and}$$

$$\frac{s_1^3}{s_3} = \frac{(1+\alpha^p)^3}{1+\alpha^{3p}}.$$

According to the assumption that the errors with the distances 1 and p are not able to be distinguished, it holds that:

$$\frac{(1+\alpha)^3}{1+\alpha^3} = \frac{(1+\alpha^p)^3}{1+\alpha^{3p}}. \quad (13)$$

With $$1+\alpha^3=(1+\alpha+\alpha^2)(1+\alpha), \quad (14)$$

$$1+\alpha^{3p}=(1+\alpha^p+\alpha^{2p})(1+\alpha^p), \quad (15)$$

$$(1+\alpha)^3=(1+\alpha^2)(1+\alpha) \text{ and} \quad (16)$$

$$(1+\alpha^p)^3=(1+\alpha^{2p})(1+\alpha^p) \quad (17)$$

the two sides of equation (13) may be represented as $$\frac{(1+\alpha)^3}{1+\alpha^3} = \frac{(1+\alpha^2)(1+\alpha)}{(1+\alpha+\alpha^2)(1+\alpha)} = \frac{1+\alpha^2}{1+\alpha+\alpha^2}$$

$$\frac{(1+\alpha^p)^3}{1+\alpha^{3p}} = \frac{(1+\alpha^{2p})(1+\alpha^p)}{(1+\alpha^p+\alpha^{2p})(1+\alpha^p)} = \frac{1+\alpha^{2p}}{1+\alpha^p+\alpha^{2p}}$$

and equation (13) thus becomes $$\frac{1+\alpha^2}{1+\alpha+\alpha^2} = \frac{1+\alpha^{2p}}{1+\alpha^p+\alpha^{2p}}. \quad (18)$$

Multiplying this out gives $$(1+\alpha^2)(1+\alpha^p+\alpha^{2p})=(1+\alpha^{2p})(1+\alpha+\alpha^2)$$

$$1+\alpha^p+\alpha^{2p}+\alpha^2+\alpha^{p-2}+\alpha^{2p+2}=1+\alpha+\alpha^2+\alpha^{2p}+\alpha^{2p+1}+\alpha^{2p+2}$$

$$\alpha^p+\alpha^{p+2}=\alpha+\alpha^{2p+1}$$

$$\alpha+\alpha^p+\alpha^{p+2}+\alpha^{2p+1}=\overline{0}$$

$$(\alpha+\alpha^p)(1+\alpha^{p+1})=\overline{0}$$

with the solutions $p=1$ and $p=-1$.

Since $p$ in the Galois field $GF(2^m)$ is considered modulo $2^m-1$, $$p=2^m-2$$

is also a solution to equation (19). In the cyclic code present here, a 2-bit error at the bit positions 0 and $2^m-2$ is also an adjacent 2-bit error.

CITATIONS

[1] Okano, Imai: A construction method for high speed decoders using ROMs for Bose-Chadhuri-Hocquenhem and Reed Solomon Code, IEEE Trans. Comp. C36 (10), pages 1165 to 1171, 1987
[2] S. Lin, D. Costello: Error Control Coding, Prentice Hall, 1983, pages 153 to 169
[3] J Swoboda: Codierung zur Fehlerkorrektur and Fehlererkennung [Error correction and error detection coding], Oldenbourg-Verlag 1973, pages 85 to 89
[4] DE 10 2020 110 787 B3
[5] DE 10 2018 126 685 B3
[6] M. Abramovici et al.: Digital Systems Testing and Testable Design, Computer Science Press, 1990, page 59
[7] S. Lin, D. Costello: Error Control Coding, Prentice Hall, 1983, pages 148 and 149, Example 6.2

The invention claimed is:

1. A method, comprising:
   storing a sequence of bits in successive memory cells of a memory circuit; and
   using a processor circuit, which is coupled to the memory circuit, to carry out the following acts:
   processing errors in the sequence of bits, wherein the sequence of bits, in an error-free case, forms a codeword of an error code, wherein the error code is based on an H-matrix or is able to be determined by the H-matrix;
   determining an error syndrome for the sequence of bits;
   when the error syndrome is other than 0, determining a link between components of the error syndrome and parts of the H-matrix;
   inverting the components of the error syndrome when the corresponding linked components of columns of the H-matrix have an odd number of ones, and leaving the components of the error syndrome non-inverted when corresponding linked components of the columns of the H-matrix have an even number of ones; and
   determining a correction signal has a value of one or zero, where the correction signal has the value of one when the linked value of the error syndrome with the components of two adjacent columns has a predefined Boolean value, and wherein the correction signal has the value of zero when the linked value of the error syndrome with the components of two adjacent columns has a value other than the predefined Boolean value; and
   correcting two adjacent bits in the sequence of bits when the correction signal adopts the value of one.

2. The method of claim 1, wherein the two adjacent bits in the sequence of bits are corrected when the predefined Boolean value is 1.

3. The method of claim 2, in which the two adjacent bits in the sequence of bits are corrected when the link adopts a predefined value in a predefined number of components.

4. The method of claim 3, in which the predefined number of components corresponds to a number that is fewer than all of the predefined number of components.

5. The method of claim 2, in which the two adjacent bits in the sequence of bits are not corrected when the link does not adopt the predefined Boolean value and/or adopts a value different from the predefined Boolean value.

6. The method of claim 2, in which the two adjacent bits of the sequence of bits are corrected simultaneously or at least partially simultaneously.

7. The method of claim 1, in which the components of the error syndrome are sub-error syndromes of the error syndrome.

8. The method of claim 1, in which the parts of the H-matrix are
   components of the H-matrix,
   columns of the H-matrix, and/or
   sub-matrices of the H-matrix.

9. The method of claim 1, in which the two adjacent bits of the sequence of bits are corrected, wherein each of the bits has a bit position that corresponds to a column of the H-matrix.

10. The method of claim 1, in which components of the error syndrome are linked with parts of the H-matrix by linking the components of the error syndrome with at least two columns of the H-matrix or with components of two columns of the H-matrix.

11. The method of claim 10, in which the at least two columns of the H-matrix are adjacent to one another.

12. The method of claim 10, in which components of adjacent columns of the H-matrix are linked with components of the error syndrome.

13. The method of claim 1, in which the predefined Boolean value is equal to a vector.

14. The method of claim 1, in which the error code is able to correct at least 2-bit errors.

15. The method of claim 1, in which the error code is a BCH code, the error syndrome comprises a first sub-error syndrome and a second sub-error syndrome, and components of the first sub-error syndrome are linked with corresponding components of columns of the H-matrix.

16. A computer program product that is able to be loaded directly into a memory of a digital computer and comprises program code portions that are configured to perform acts of the method of claim 1.

17. The method of claim 1, wherein the two adjacent bits in the sequence of bits are corrected only when the correction signal adopts the predefined Boolean value, and when the correction signal has any value other than the predefined Boolean value the two adjacent bits are left un-changed.

* * * * *